US010014366B1

(12) United States Patent
Kanawati

(10) Patent No.: US 10,014,366 B1
(45) Date of Patent: Jul. 3, 2018

(54) TAPERED POLYSILICON GATE LAYOUT FOR POWER HANDLING IMPROVEMENT FOR RADIO FREQUENCY (RF) SWITCH APPLICATIONS

(71) Applicant: Newport Fab, LLC, Newport Beach, CA (US)

(72) Inventor: Roda Kanawati, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/462,482

(22) Filed: Mar. 17, 2017

(51) Int. Cl.
*H01L 29/41* (2006.01)
*H01L 29/06* (2006.01)
*H01L 27/12* (2006.01)
*H01L 29/78* (2006.01)
*H03K 17/687* (2006.01)
*H01L 29/49* (2006.01)

(52) U.S. Cl.
CPC ...... *H01L 29/0611* (2013.01); *H01L 27/1203* (2013.01); *H01L 29/0649* (2013.01); *H01L 29/4983* (2013.01); *H01L 29/7834* (2013.01); *H03K 17/6872* (2013.01)

(58) Field of Classification Search
CPC ..... H01L 27/1203; H01L 27/12; H01L 21/84; H01L 21/823807; H01L 21/775; H01L 29/41
See application file for complete search history.

(56) References Cited

U.S. PATENT DOCUMENTS 6,248,631 B1 * 6/2001 Huang ............... H01L 27/115
257/E21.682
6,864,536 B2 * 3/2005 Lin .................. H01L 27/0259
257/355

* cited by examiner

*Primary Examiner* — Quoc Hoang
(74) *Attorney, Agent, or Firm* — Bever, Hoffman & Harms, LLP

(57) ABSTRACT

A radio frequency (RF) switch includes a plurality of series-connected silicon-on-insulator (SOI) CMOS transistors, including a plurality of parallel source/drain regions, a plurality of channel regions located between the plurality of source/drain regions, and a polysilicon gate structure located over the plurality of channel regions. The polysilicon gate structure includes a plurality of polysilicon gate fingers, wherein each polysilicon gate finger extends over a corresponding one of the channel regions. The polysilicon gate structure also includes a polysilicon base region that connects first ends of the polysilicon gate fingers. The polysilicon gate structure also includes triangular polysilicon extension regions coupled to the polysilicon gate fingers. The triangular extension regions can be located at the first ends of the polysilicon gate fingers (abutting the polysilicon base region), or at second (opposing ends) of the polysilicon gate fingers.

21 Claims, 10 Drawing Sheets

US 10,014,366 B1

TAPERED POLYSILICON GATE LAYOUT FOR POWER HANDLING IMPROVEMENT FOR RADIO FREQUENCY (RF) SWITCH APPLICATIONS

FIELD OF THE INVENTION

The present invention relates to a semiconductor structure including a plurality of series-connected silicon-on-insulator (SOI) CMOS transistors, which can be used to implement a radio frequency (RF) switch. More specifically, the present invention relates to the addition of triangular extension regions to polysilicon gate fingers to improve the power handling capabilities of the associated SOI CMOS transistors.

RELATED ART

FIG. 1 is a circuit diagram of a conventional radio frequency (RF) circuit 100, including an antenna 101, an RF receiver switch 110, an RF receiver port 115, an RF transmitter switch 120 and an RF transmitter port 125. RF receiver switch 110 includes a plurality of high-voltage field effect transistors (FETs) $110_1$-$110_N$, which are connected in series (in a stack). The stack of high voltage FETs $110_1$-$110_N$ is controlled to route RF signals from antenna 101 to receive port 115. Similarly, RF transmitter switch 120 includes a stack of high-voltage FETs $120_1$-$120_N$, which are controlled to route RF signals from transmit port 125 to antenna 101. As used herein, an RF signal is defined as a signal having a frequency in the range of about 10 kHz to 50 GHz. The FETs used in the switch branch stack are large, typically 1-5 mm (millimeter) in total width. It is understood that FIG. 1 is a simplified schematic for illustrative purposes and that many features of a full RF switch product related to biasing, voltage balance, etc., are not shown.

Silicon-on-insulator (SOI) CMOS technologies are now the dominant platforms for creating best-in-class radio frequency switch (RFSW) products for handsets and other mobile devices. Thus, transistors $110_1$-$110_N$ and $120_1$-$120_N$ are typically implemented using SOI CMOS transistors. Such SOI CMOS transistors enable the associated RF switches 110 and 120 to transmit RF signals in the range of 0.5 GHz to 6 GHz with a high degree of linearity, while withstanding voltages of 40V to 70V and in an off-state. Because SOI CMOS technology uses standard CMOS technologies and standard cell libraries, RF switches that implement SOI CMOS transistors can be readily integrated into larger system-on-chip (SOC) devices, thereby minimizing fabrication costs. For example, transistors $110_1$-$110_N$ and $120_1$-$120_N$ and transistors associated with receive port 115 and transmit port 125 may be fabricated on the same integrated circuit chip.

As described herein, an SOI CMOS technology includes any process that can be used to fabricate SOI CMOS transistors. Thus, a process that can be used to integrate the fabrication of both SOI CMOS transistors and other types of transistors (e.g., SiGe BiCMOS transistors) is considered to be an SOI CMOS process.

For RF switch 110 (or 120), the on-resistance of the switch ($R_{ON}$) multiplied by the off-capacitance of the switch ($C_{OFF}$) is a key figure of merit, which dictates the ability to transmit RF power with low losses through on-state transistor stacks, while maintaining adequate isolation across off-state transistor stacks. The thin film SOI CMOS transistors are attractive for RF switch applications, because these transistors reduce the junction capacitance component of the off-capacitance value, $C_{OFF}$.

Typically, the off-state stacks of an RF switch need to hold off relatively high voltage RF signals (e.g., 40-70V). Consequently, RF switches are implemented with older generation SOI CMOS transistors having operating voltages in the 2.5 Volt-5 Volt range. These older generation SOI CMOS transistors are fabricated using process nodes with a minimum feature size of 0.18 microns or greater. In general, the gate length of each of transistors $110_1$-$110_N$ and $120_1$-$120_N$ must be about 0.18 microns or more to provide the required off-state isolation. Note that transistors fabricated using more advanced process nodes (e.g., a 0.13 micron process node) have lower operating voltages (e.g., 1.2 Volts or lower), and are typically not suitable for implementing an RF switch.

FIG. 2A is a top view of a conventional SOI CMOS structure 200, which includes n-channel SOI CMOS transistors 201-203, which are fabricated in an active semiconductor region 210 using a conventional 0.18 micron SOI CMOS process node. FIG. 2B is a cross-sectional view of SOI CMOS structure 200 along section line B-B of FIG. 2A. Note that not all of the elements of SOI CMOS structure 200 are shown in FIG. 2A for clarity. Transistors similar to n-channel SOI CMOS transistors 201-203 can be used to implement transistors $110_1$-$110_N$ and $120_1$-$120_N$ of RF switches 110 and 120.

Polysilicon gate structure 230 includes a plurality of rectangular polysilicon gate fingers 231-233, which are joined by a rectangular polysilicon base region 234. The rectangular gate fingers 231-233 extend in parallel with one another. The rectangular base region 234 is located perpendicular to the gate fingers 231-233, such that 90 degree angles are formed where the gate fingers 231-233 meet the base region 234. Although gate fingers 231-233 and gate base region 234 are illustrated as distinct rectangles in FIG. 2A, it is understood that gate fingers 231-233 and gate base region 234 are a single continuous polysilicon element.

SOI CMOS transistors 201-203 are fabricated on a thin silicon layer 206, which is located on a buried insulating layer 205 (e.g., silicon oxide), which in turn, is located on a substrate 204 (e.g., monocrystalline silicon).

N-channel SOI CMOS transistor 201 includes an n-type source/drain region 211 (which includes lightly doped source/drain region 211A and source/drain contact region 211B), an n-type source/drain region 212 (which includes lightly doped source/drain region 212A and source/drain contact region 212B), gate dielectric 221, polysilicon gate finger 231, dielectric sidewall spacers 241-242 and metal silicide regions 251-253. A p-type channel region 215 exists between the source/drain region 211 and the source/drain region 212.

N-channel SOI CMOS transistor 202 includes an n-type source/drain region 212 (which includes lightly doped source/drain region 212C and source/drain contact region 212B), an n-type source/drain region 213 (which includes lightly doped source/drain region 213A and source/drain contact region 213B), gate dielectric 222, polysilicon gate finger 232, dielectric sidewall spacers 243-244 and metal silicide regions 253-255. A p-type channel region 216 exists between the source/drain region 212 and the source/drain region 213.

N-channel SOI CMOS transistor 203 includes an n-type source/drain region 213 (which includes lightly doped source/drain region 213C and source/drain contact region 213B), an n-type source/drain region 214 (which includes lightly doped source/drain region 214A and source/drain contact region 214B), gate dielectric 223, polysilicon gate finger 233, dielectric sidewall spacers 245-246 and metal silicide regions 255-257. A p-type channel region 217 exists between the source/drain region 232 and the source/drain region 214. To implement a typical RF switch, each of the polysilicon gate fingers 231-233 has a length ($L_G$) of 0.18 microns or more.

A multi-layer interconnect structure is fabricated over transistors 201-203, thereby providing electrical connections to these transistors (and other devices fabricated in the thin silicon layer 206). In the example illustrated, a pre-metal dielectric (PMD) structure 260 is formed over transistors 201-203. Metal contacts, such as contacts 261-264 (which are illustrated as squares containing an "X" in FIG. 2A), extend through the PMD structure 260 and contact the silicide regions 251, 253, 255 and 257, respectively, as illustrated. A first metal layer (M1), including metal traces 271-274, is formed over PMD structure 260. Additional dielectric layers, metal vias and metal layers (not shown) are formed over the PMD structure 260 and the first metal layer (M1) in a manner known in the art.

In order to reduce the $R_{ON} \times C_{OFF}$ value associated with an RF switch that implements the transistors 201-203 of the semiconductor structure 200 of FIGS. 2A-2B, the length of the gate ($L_G$) can be reduced. Reducing the lengths ($L_G$) of polysilicon gate fingers 231-233 desirably reduces the off-capacitances ($C_{OFF}$) of the associated RF switches 110 and 120 (due to the reduced area of the polysilicon gate fingers 231-233). Moreover, reducing the lengths ($L_G$) of polysilicon gate fingers 231-233 desirably reduces the on-resistances ($R_{ON}$) of the associated RF switches 110 and 120 (due to the reduced channel length width associated with the narrower polysilicon gate fingers 231-233). However, reducing the lengths ($L_G$) of the polysilicon gate fingers 231-233 undesirably reduces the breakdown voltages of transistors 201-203, which can prevent the RF switch from operating at the required power handling level. For example, a gate finger 231 having a gate length ($L_G$) of about 0.20 microns may result in the corresponding transistor 201 having an AC breakdown voltage of about 4.51 Volts. However, reducing the gate length ($L_G$) of gate finger 231 to 0.19 microns will undesirably reduce the AC breakdown voltage of the corresponding transistor 201 to about 4.35 Volts.

It would therefore be desirable to have an improved SOI CMOS transistor structure for implementing an RF switch. It would be desirable for the improved SOI CMOS transistor structure to exhibit a relatively small $R_{ON} \times C_{OFF}$ value, while maintaining a relatively large breakdown voltage. It would further be desirable if this improved SOI CMOS transistor structure can be fabricated using conventional fabrication process nodes.

SUMMARY

Accordingly, the present invention provides a radio frequency (RF) switch that includes a plurality of series-connected silicon-on-insulator (SOI) CMOS transistors, wherein each of the SOI CMOS transistors includes a polysilicon gate finger having a plurality of triangular polysilicon extension regions. More specifically, the series-connected SOI CMOS transistors include a plurality of parallel source/drain regions, a plurality of channel regions located between the plurality of source/drain regions, and a polysilicon gate structure. The polysilicon gate structure includes: a plurality of polysilicon gate fingers, wherein each polysilicon gate finger extends over a corresponding one of the channel regions; a polysilicon base region that connects first ends of the polysilicon gate fingers; and polysilicon triangular extension regions that extend from polysilicon gate fingers. The triangular polysilicon extension regions can be located at the first ends of the polysilicon gate fingers (abutting the polysilicon base region), or at second (opposing ends) of the polysilicon gate fingers.

The triangular polysilicon extension regions enable the lengths of the polysilicon gate fingers (i.e., the transistor channel lengths) to be reduced, while maintaining the power handling capability of the associated transistors, and reducing the $R_{ON} \times C_{OFF}$ values associated with the transistors.

The present invention will be more fully understood in view of the following description and drawings.

DETAILED DESCRIPTION

In general, the present invention includes an improved semiconductor structure for implementing a plurality of n-channel SOI CMOS transistors connected in series. In one embodiment, the series-connected SOI CMOS transistors are used to implement an RF switch.

The n-channel SOI CMOS transistors are fabricated in accordance with a conventional SOI CMOS process node. In accordance with the present invention, triangular polysilicon extension regions are added to rectangular polysilicon gate fingers, thereby raising the breakdown voltages of the associated transistors. In various embodiments, the triangular polysilicon extension regions may be located at either end of the polysilicon gate fingers. The triangular polysilicon extension regions can have various sizes. The addition of the triangular polysilicon extension regions allows the lengths of the polysilicon gate fingers to be reduced, while maintaining the alternating current (AC) breakdown voltages of the associated transistors. Reducing the lengths of the polysilicon gate fingers advantageously reduces the on-resistance ($R_{ON}$) and the off-capacitance ($C_{OFF}$) value of the associated RF switch. The present invention is described in more detail below.

Figure 1:
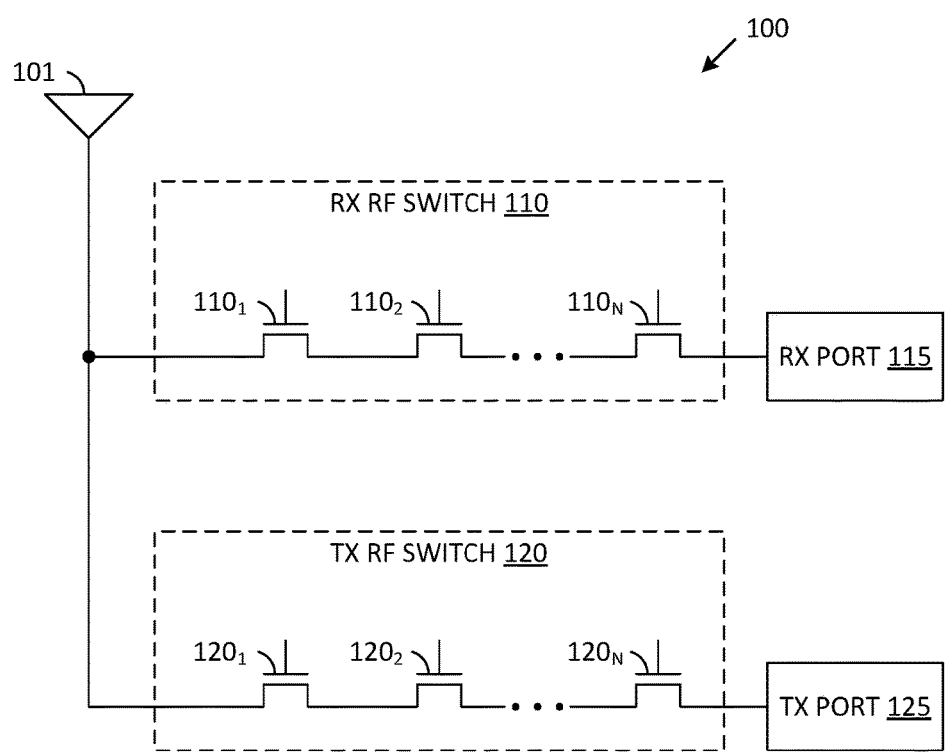
FIG. 1 is a circuit diagram of a conventional RF switch structure.
Figure 3A:
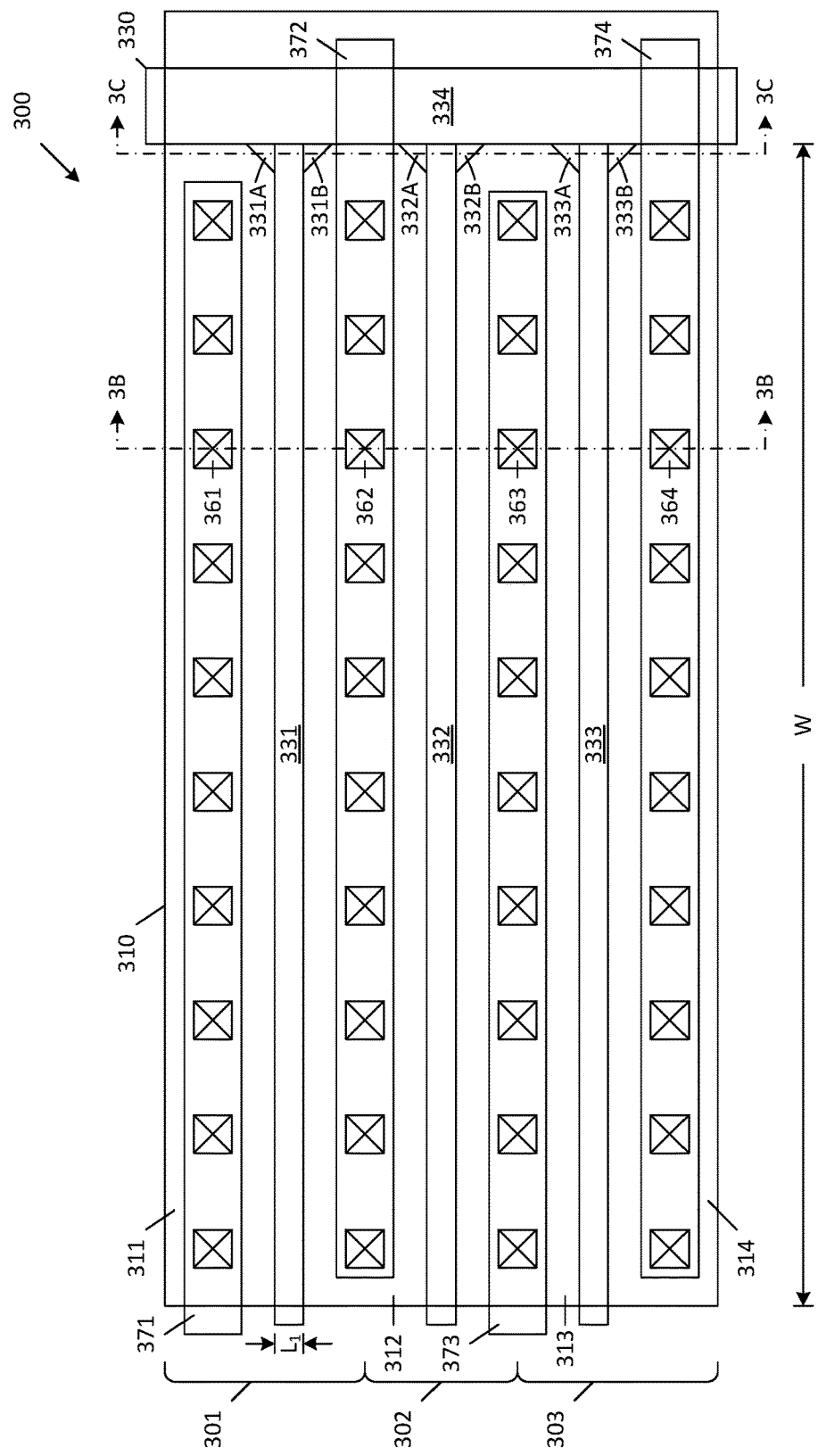
FIG. 3A is a top layout view of a RF switch structure that includes n-channel SOI CMOS transistors having triangular gate extensions in accordance with one embodiment of the present invention.
Figure 3B:
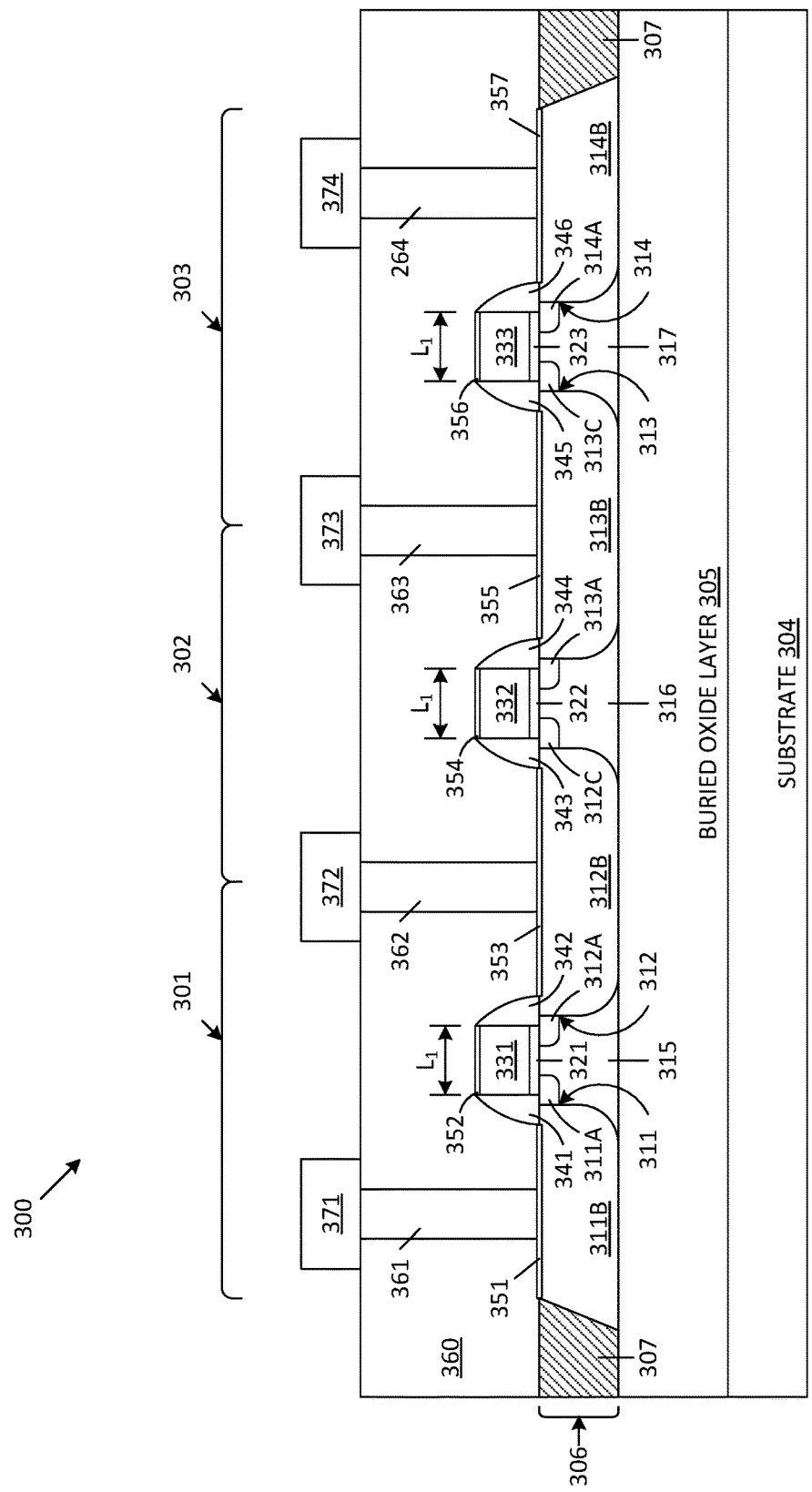
FIG. 3B is a cross sectional view of the SOI CMOS transistors of FIG. 3A along section line 3B-3B.
Figure 3C:
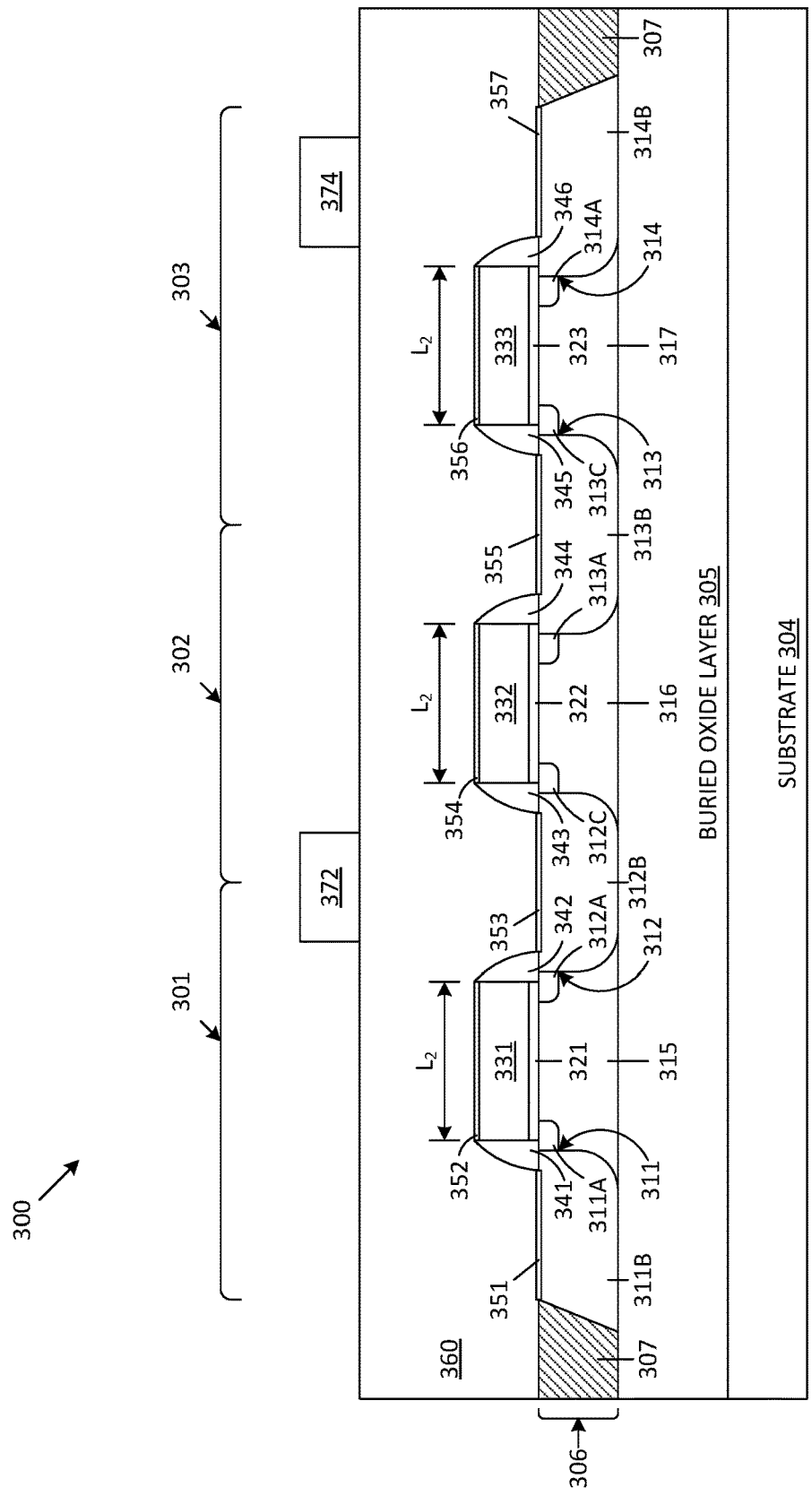
FIG. 3C is a cross sectional view of the SOI CMOS transistors of FIG. 3A along section line 3C-3C.

FIG. 3A is a top view of a SOI CMOS structure 300, which includes n-channel SOI CMOS transistors 301-303, which are fabricated in an active semiconductor region 310 using a conventional 0.18 micron SOI CMOS process node. FIG. 3B is a cross-sectional view of SOI CMOS structure 300 along section line 3B-3B of FIG. 3A. FIG. 3C is a cross-sectional view of SOI CMOS structure 300 along section line 3C-3C of FIG. 3A. Note that not all of the elements of SOI CMOS structure 300 are shown in FIG. 3A for clarity. In accordance with one embodiment of the present invention, transistors similar to n-channel SOI CMOS transistors 301-303 are used to implement transistors $110_1$-$110_N$ and $120_1$-$120_N$ of RF switches 110 and 120 (FIG. 1). Note that although only three transistors 301-303 are illustrated by FIGS. 3A-3C, the disclosed structure 300 can be readily expanded to implement other numbers of series-connected transistors, as required by the particular application.

Figure 2A:
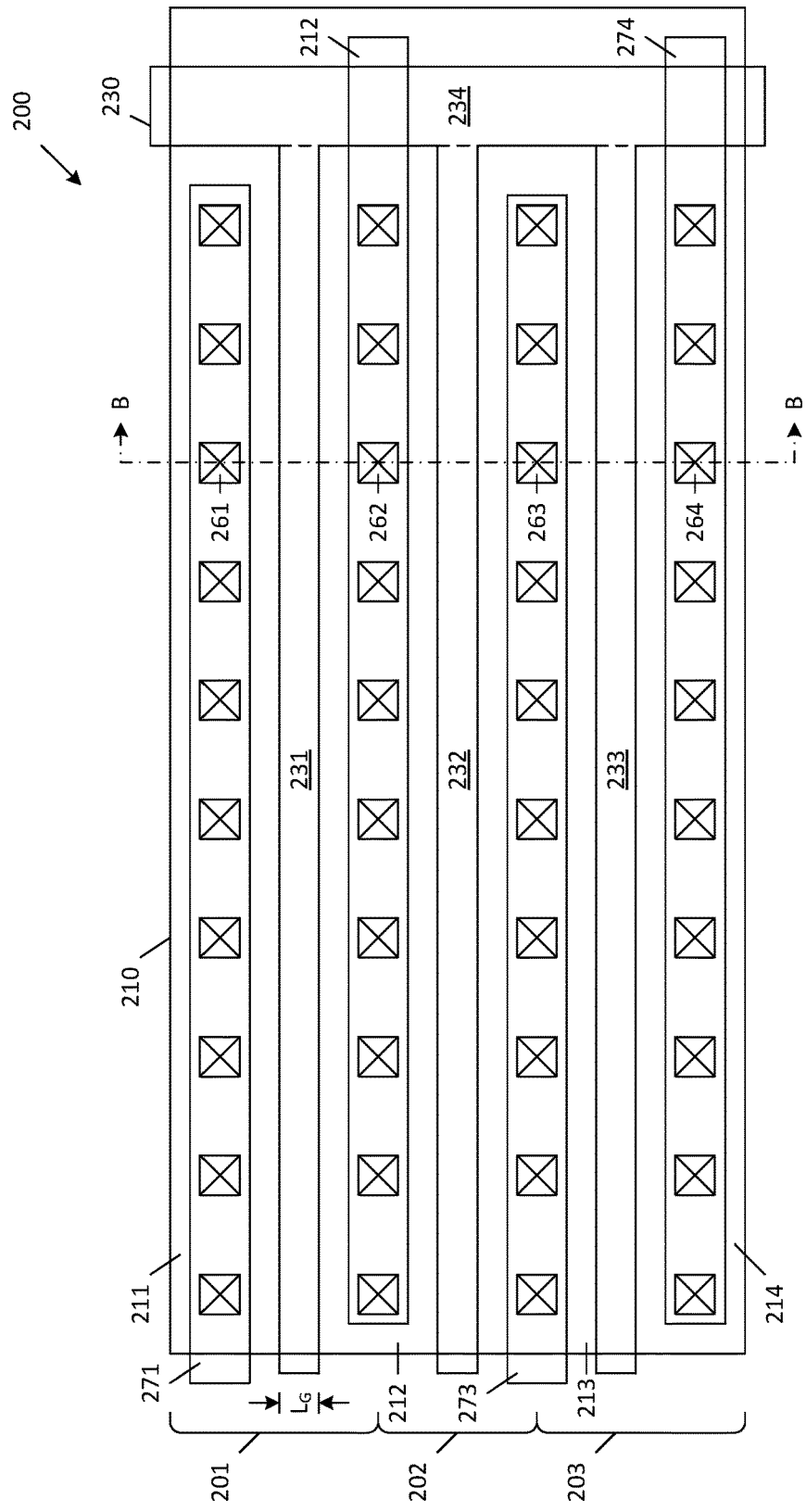
FIG. 2A is a top layout view of a conventional RF switch structure that uses conventional SOI CMOS transistors to implement the RF switch of FIG. 1.
Figure 2B:
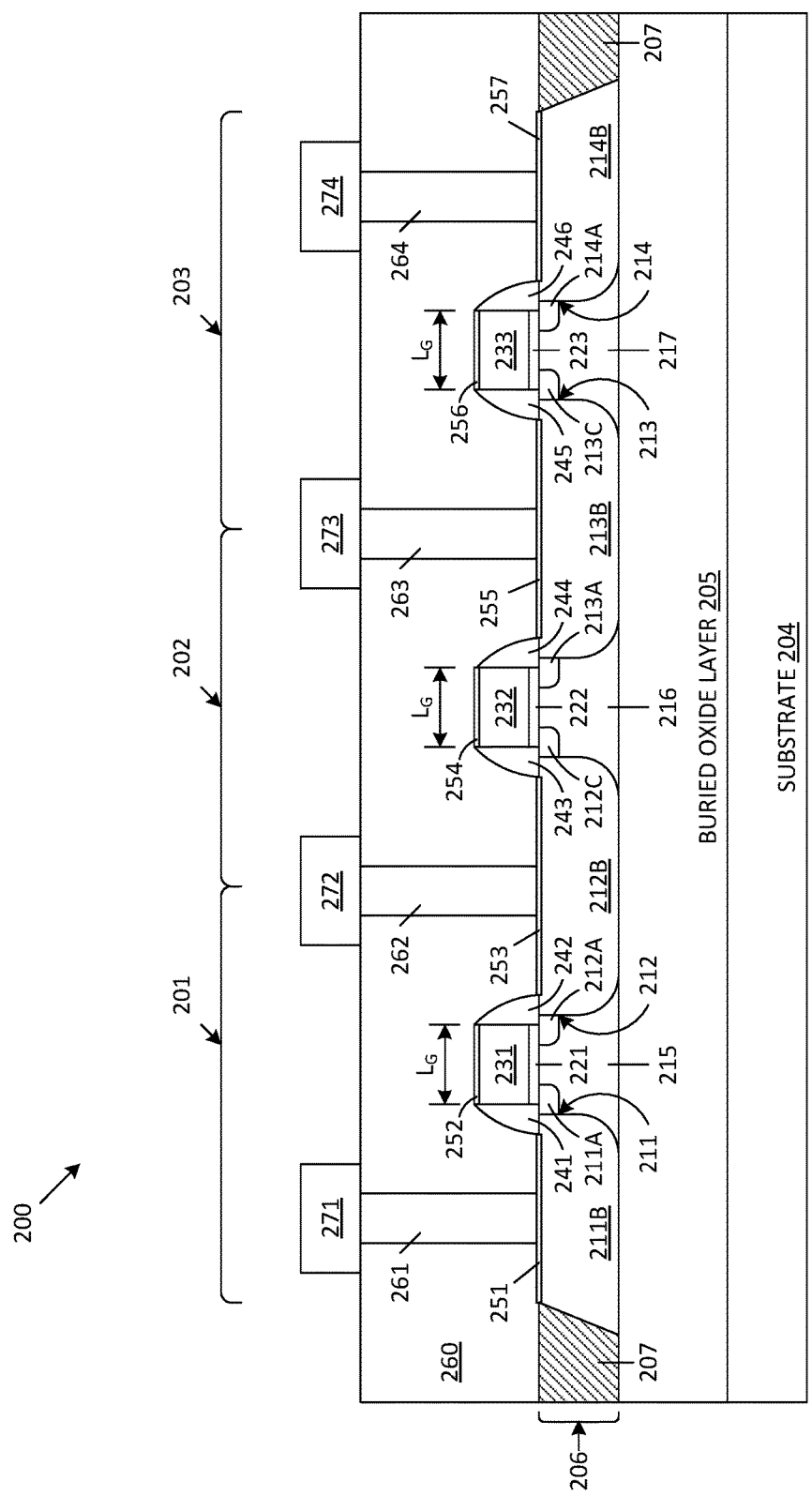
FIG. 2B is a cross sectional view of the SOI CMOS transistors of FIG. 2A.

The SOI CMOS structure 300 of FIGS. 3A-3C is similar to the SOI CMOS structure 200 of FIGS. 2A-2B, with the main difference being that the polysilicon gate structure 330 of FIGS. 3A-3C is different than the polysilicon gate structure 230 of FIGS. 2A-2B. More specifically, polysilicon gate structure 330 includes a plurality of rectangular gate fingers 331-333, a plurality of triangular extension regions 331A-331B, 332A-332B and 333A-333B, and a rectangular base region 334. The rectangular polysilicon gate fingers 331-333 (each of which has a gate length $L_1$ that is less than the gate length $L_G$ of gate fingers 231-233) extend in parallel with one another. The rectangular base region 334 is located perpendicular to the gate fingers 331-333. Triangular extension regions 331A-331B, 332A-332B and 333A-333B, are located where the ends of polysilicon gate fingers 331, 332 and 333, respectively, meet the rectangular base region 334. Thus, the triangular extension regions 331A-331B, 332A-332B and 333A-333B effectively increase the gate length of the gate fingers 331-333 near the rectangular base region 334. Note that the triangular extension regions 331A-331B, 332A-332B and 333A-333B effectively prevent the gate fingers 331-333 from meeting the base region 334 at a 90 degree angle. Although the polysilicon gate fingers 331-333, the triangular polysilicon extension regions 331A-331B, 332A-332B and 333A-333B and the polysilicon base region 334 are illustrated as distinct polygons in FIG. 3A, it is understood that gate fingers 331-333, the triangular extension regions 331A-331B, 332A-332B and 333A-333B and the base region 334 are a single continuous polysilicon element.

SOI CMOS transistors 301-303 are fabricated on a thin silicon layer 306, which is located on a buried insulating layer 305 (e.g., silicon oxide), which in turn, is located on a substrate 304 (e.g., monocrystalline silicon). The active region 310, which is surrounded by shallow trench isolation region 307, is formed in thin silicon layer 306.

N-channel SOI CMOS transistor 301 includes an n-type source/drain region 311 (which includes lightly doped source/drain region 311A and source/drain contact region 311B), an n-type source/drain region 312 (which includes lightly doped source/drain region 312A and source/drain contact region 312B), gate dielectric 321, polysilicon gate finger 331, dielectric sidewall spacers 341-342 and metal silicide regions 351-353. A p-type channel region 315 exists between the source/drain region 311 and the source/drain region 312.

N-channel SOI CMOS transistor 302 includes an n-type source/drain region 312 (which includes lightly doped source/drain region 312C and source/drain contact region 312B), an n-type source/drain region 313 (which includes lightly doped source/drain region 313A and source/drain contact region 313B), gate dielectric 322, polysilicon gate finger 332, dielectric sidewall spacers 343-344 and metal silicide regions 353-355. A p-type channel region 316 exists between the source/drain region 312 and the source/drain region 313.

N-channel SOI CMOS transistor 303 includes an n-type source/drain region 313 (which includes lightly doped source/drain region 313C and source/drain contact region 313B), an n-type source/drain region 314 (which includes lightly doped source/drain region 314A and source/drain contact region 314B), gate dielectric 323, polysilicon gate finger 333, dielectric sidewall spacers 345-346 and metal silicide regions 355-357. A p-type channel region 317 exists between the source/drain region 332 and the source/drain region 314.

Dielectric sidewall spacers 341-342, 343-344 and 345-346 are formed adjacent to gate electrodes 331, 332 and 333, respectively, and metal silicide regions 351, 352, 353, 354, 355, 356 and 357 are formed over source/drain region 311, gate finger 331, source/drain region 312, gate finger 332, source/drain region 313, gate finger 333 and source/drain region 314, respectively.

A multi-layer interconnect structure is fabricated over transistors 301-303, thereby providing electrical connections to these transistors (and other devices fabricated in the thin silicon layer 306). In the example illustrated, a pre-metal dielectric (PMD) structure 360 is formed over transistors 301-303. Metal contacts, such as contacts 361-364 (which are illustrated as squares containing an "X" in FIG. 3A), extend through the PMD structure 360 and contact the silicide regions 351, 353, 355 and 357, respectively, as illustrated. A first metal layer (M1), including metal traces 371-374, is formed over PMD structure 360. Additional dielectric layers, metal vias and metal layers (not shown) are formed over the PMD structure 360 and the first metal layer (M1) in a manner known in the art.

In accordance with one embodiment, transistors 301-303 and the associated multi-layer interconnect structure are fabricated in accordance with a conventional 0.18 micron SOI CMOS process node.

To implement a RF switch, each of the polysilicon gate fingers 331-333 may have a length ($L_1$) of 0.18 microns or more. In accordance with one embodiment, each of the polysilicon gate fingers 331-333 has a length ($L_1$) of about 0.19 microns. The width (W) of each of the polysilicon gate fingers 331-333 over the active region can be, for example, 7 to 20 microns.

In a particular embodiment, each of the polysilicon gate fingers 331-333 has a width (W) of about 15 microns and a length ($L_1$) of about 0.19 microns, and each of the triangular extension regions 331A-331B, 332A-332B and 333A-333B has a base length of about 0.1 microns and a height of about 0.1 microns.

Figure 4:
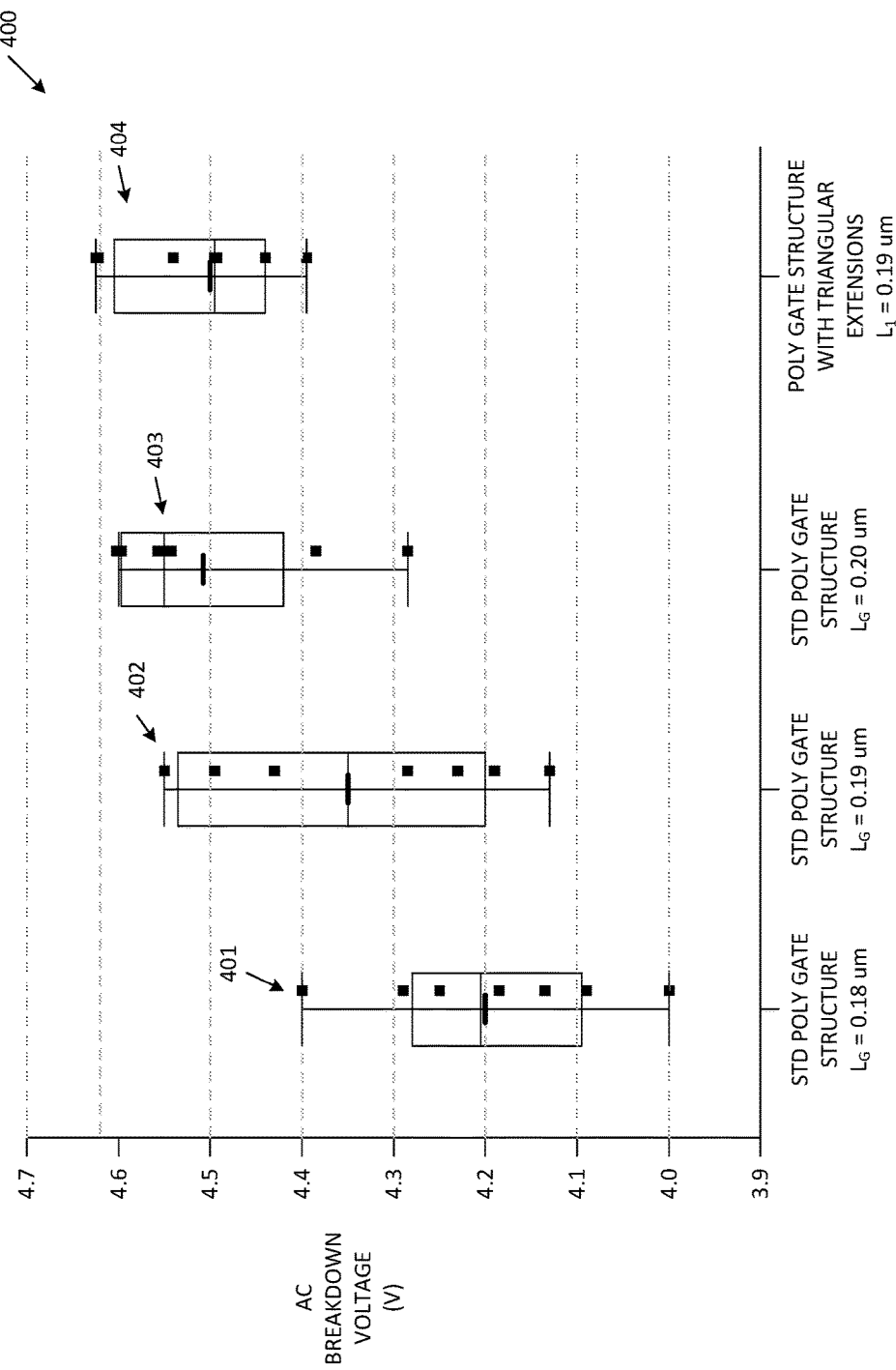
FIG. 4 is a chart illustrating exemplary AC breakdown voltage sample groups for conventional transistors having polysilicon gate finger lengths of 0.18 microns, 0.19 microns and 0.20 microns, and a transistor having a polysilicon gate finger length of 0.19 microns and triangular gate extension regions in accordance with one embodiment of the present invention.

Advantageously, the triangular extension regions 331A-331B, 332A-332B and 333A-333B increase the AC breakdown voltage of the associated transistors 301-303. FIG. 4 is a chart 400 illustrating exemplary AC breakdown voltage sample groups 401, 402 and 403 for a conventional transistor (e.g., transistor 201) having polysilicon gate finger lengths ($L_G$) of 0.18 microns, 0.19 microns and 0.20 microns, respectively, and polysilicon gate finger widths (W) of 15 microns. FIG. 4 also illustrates an exemplary AC breakdown voltage sample group 404 for a transistor (e.g., transistor 301) having a polysilicon gate finger length ($L_1$) of 0.19 microns, a polysilicon gate finger width (W) of 15 microns, and associated 0.1×0.1 micron triangular extension regions (e.g., triangular extension regions 331A-331B) as illustrated in FIG. 3A. Note that conventional transistors having polysilicon gate finger lengths ($L_G$) of 0.18 microns, 0.19 microns and 0.20 microns have average AC breakdown voltages of about 4.2 Volts, 4.35 Volts and 4.51 Volts, respectively, while a transistor in accordance with the invention, having a polysilicon gate finger length $L_1$ of 0.19 microns and 0.1×0.1 micron triangular extension regions, has an average AC breakdown voltage of about 4.5 Volts.

Thus, in the example illustrated by FIG. 4, the triangular extension regions 331A-331B advantageously increase the AC breakdown voltage of a transistor 301 having a 0.19 gate length ($L_1$) to approximately the same AC breakdown voltage as a conventional transistor 201 having a 0.20 micron gate length ($L_G$). Viewed another way, adding the triangular extension regions 331A-331B to a conventional transistor having a 0.19 gate length ($L_1$) advantageously increases the AC breakdown voltage of the transistor by about 0.15 Volts.

Figure 5:
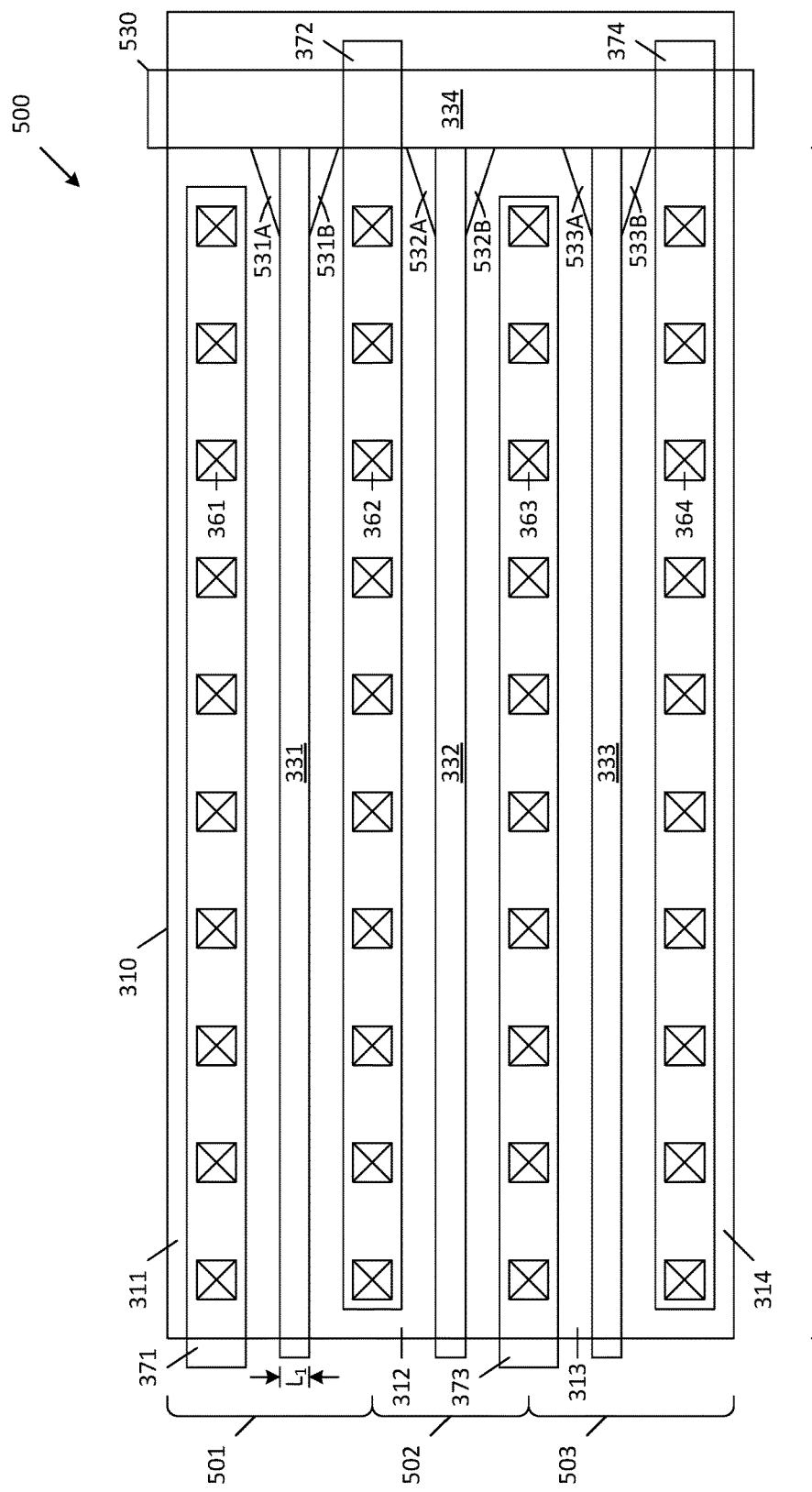
FIG. 5 is a top layout view of a RF switch structure that includes SOI CMOS transistors having triangular gate extensions in accordance with an alternate embodiment of the present invention.

Moreover, a transistor 301 including triangular extension regions 331A-331B and having a 0.19 micron gate length ($L_1$) will have an on-resistance that is less than the on-resistance of a conventional transistor 201 having a 0.20 micron gate length ($L_G$), due to the shorter gate length. In addition, for transistors having a gate finger width (W) greater than 1 micron, a transistor 301 including triangular extension regions 331A-331B and having a 0.19 gate length ($L_1$) will have an off-capacitance that is less than the off-capacitance of a conventional transistor 201 having a 0.20 gate length ($L_G$), due to a smaller layout area. As a result, the $R_{ON} \times C_{OFF}$ value of a transistor 301 including triangular extension regions 331A-331B and having a 0.19 gate length ($L_1$) will advantageously be less than the $R_{ON} \times C_{OFF}$ value of a conventional transistor 201 having a 0.20 gate length ($L_G$), Although triangular extension regions 331A-331B, 332A-332B and 333A-333B are shown as isosceles triangles in FIG. 3A, it is understood that triangular extension regions having other proportions can be used. FIG. 5 is a top layout view of a semiconductor structure 500 that includes SOI CMOS transistors 501-503 in accordance with an alternate embodiment of the present invention, wherein the triangular extension regions 331A-331B, 332A-332B and 333A-333B of FIG. 3A are replaced with scalene triangular extensions 531A-531B, 532A-532B and 533A-533B. Because transistors 501-503 of semiconductor structure 500 are similar to transistors 301-303 of semiconductor structure 300, similar elements in FIGS. 5 and 3A are labeled with similar reference numbers. Thus, semiconductor structure 500 includes a polysilicon gate structure 530 that includes rectangular polysilicon gate fingers 331-333, rectangular polysilicon base region 334, and scalene triangular extension regions 531A-531B, 532A-532B and 533A-533B. Cross sectional views of semiconductor structure 500 are similar to those presented above in FIGS. 3B and 3C. The SOI CMOS transistors 501-503 of semiconductor structure 500 exhibit the same advantages described above in connection with semiconductor structure 300.

Figure 6:
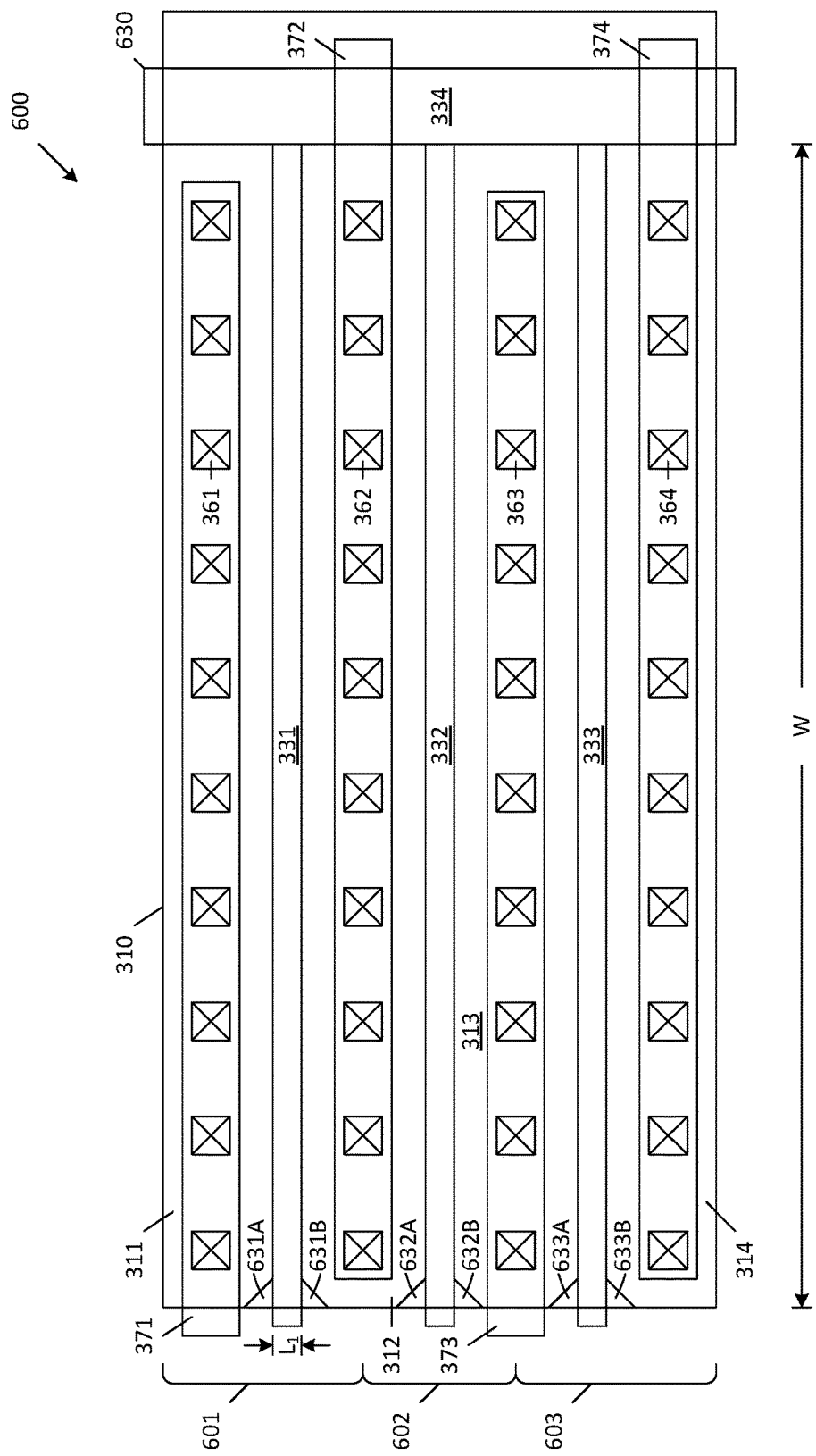
FIG. 6 is a top layout view of a RF switch structure that includes SOI CMOS transistors having triangular gate extensions at distal ends of the polysilicon gate fingers in accordance with an alternate embodiment of the present invention.

FIG. 6 is a top layout view of a semiconductor structure 600 that includes SOI CMOS transistors 601-603 in accordance with another embodiment of the present invention. Because semiconductor structure 600 is similar to semiconductor structure 300, similar elements in FIGS. 6 and 3A are labeled with similar reference numbers. Thus, semiconductor structure 600 includes a polysilicon gate structure 630 that includes rectangular polysilicon gate fingers 331-333 and rectangular polysilicon base region 334. Semiconductor structure 600 replaces the triangular extension regions 331A-331B, 332A-332B and 333A-333B of FIG. 3A with triangular extension regions 631A-631B, 632A-632B and 633A-633B. As illustrated by FIG. 6, the triangular extension regions 631A-631B, 632A-632B and 633A-633B are located at the opposite ends of the polysilicon gate fingers 331-333 (with respect to triangular extension regions 331A-331B, 332A-332B and 333A-333B). That is, triangular extension regions 631A-631B, 632A-632B and 633A-633B are located at the ends of polysilicon gate fingers 331-333 that are opposite to the ends where the polysilicon gate fingers 331-333 adjoin the rectangular base region 334. Cross sectional views of semiconductor structure 600 are similar to those presented above in FIGS. 3B and 3C. The SOI CMOS transistors 601-603 of semiconductor structure 600 exhibit the same advantages described above in connection with semiconductor structure 300.

Although the triangular extension regions 631A-631B, 632A-632B and 633A-633B of polysilicon gate structure 630 are illustrated as isosceles triangles, it is understood that these triangular extension regions can be elongated to form scalene triangles in the manner described above in connection with polysilicon gate structure 530 (FIG. 5.)

Figure 7:
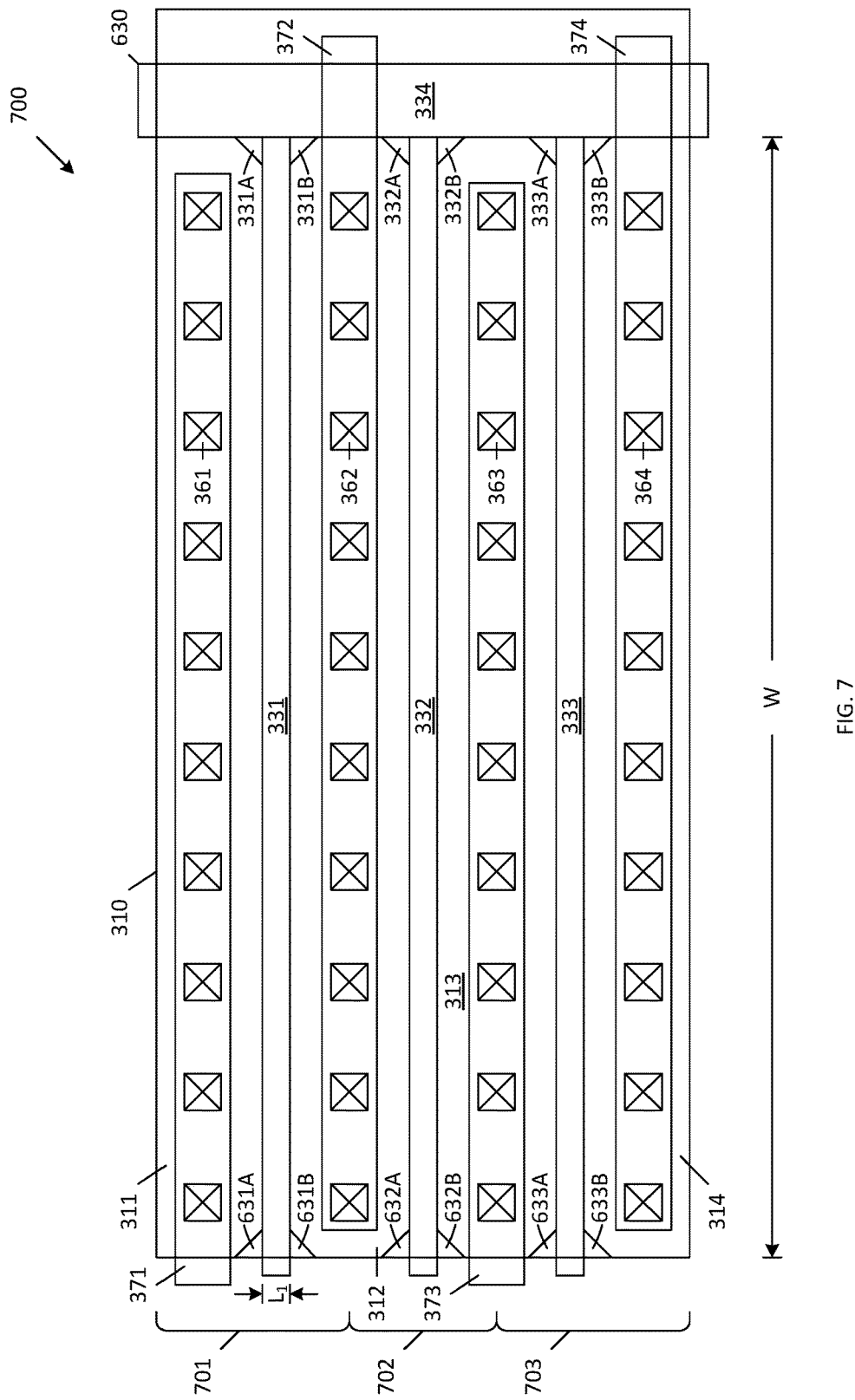
FIG. 7 is a top layout view of a RF switch structure that includes SOI CMOS transistors having triangular gate extensions at both near and distal ends of the polysilicon gate fingers in accordance with an alternate embodiment of the present invention.

In an alternate embodiment, triangular extension regions can be added at both ends of the polysilicon gate fingers 331-333. For example, both the triangular polysilicon extension regions 331A-331B, 332A-332B and 333A-333B and the triangular polysilicon extension regions 631A-631B, 632A-632B and 633A-633B can be included with polysilicon gate fingers 331-333 in an alternate embodiment of the present invention. FIG. 7 is a top layout view of a semiconductor structure 700 that includes SOI CMOS transistors 701-703 in accordance with such an alternate embodiment of the present invention. Because semiconductor structure 700 is similar to semiconductor structures 300 and 600, similar elements in FIGS. 3A, 6 and 7 are labeled with similar reference numbers.

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:
1. A semiconductor structure comprising:
    an active semiconductor region located on a buried dielectric layer, wherein the active semiconductor region includes a plurality of source/drain regions separated by a plurality of channel regions; and
    a polysilicon gate structure located over the active semiconductor region, wherein the polysilicon gate structure includes:

a plurality of polysilicon gate fingers, wherein each of the plurality of polysilicon gate fingers extends over a portion of a corresponding one of the plurality of channel regions;

a polysilicon base region that joins the plurality of polysilicon gate fingers; and a plurality of triangular polysilicon extension regions each located along and continuous with a corresponding one of the plurality of polysilicon gate fingers, wherein each of the triangular polysilicon extension regions extends over a portion of one of the plurality of channel regions, wherein the plurality of channel regions have first lengths under the polysilicon gate fingers, and wherein the plurality of channel regions have second lengths where the triangular polysilicon extension regions are continuous with the polysilicon gate fingers, wherein the second lengths are greater than the first lengths.

2. The semiconductor structure of claim 1, wherein the active semiconductor region is laterally surrounded by an isolation structure.

3. The semiconductor structure of claim 1, wherein the plurality of source/drain regions are located in parallel.

4. The semiconductor structure of claim 1, wherein the plurality of channel regions are located in parallel.

5. The semiconductor structure of claim 1, wherein the plurality of polysilicon gate fingers are located in parallel.

6. The semiconductor structure of claim 1, wherein each of the plurality of polysilicon gate fingers is rectangular.

7. The semiconductor structure of claim 1, wherein the polysilicon base region is rectangular.

8. The semiconductor structure of claim 1, wherein the polysilicon base region is located perpendicular to each of the plurality of polysilicon gate fingers.

9. The semiconductor structure of claim 1, wherein the triangular polysilicon extension regions are located at junctions of the polysilicon gate fingers and the polysilicon base region.

10. The semiconductor structure of claim 1, wherein the polysilicon base region joins the plurality of polysilicon gate fingers at first ends of the polysilicon gate fingers, and wherein the triangular polysilicon extension regions are located at second ends of the polysilicon gate fingers, opposite the first ends of the polysilicon gate fingers.

11. The semiconductor structure of claim 1, wherein the triangular polysilicon extension regions are located on opposing sides of each of the plurality of polysilicon gate fingers.

12. The semiconductor structure of claim 1, wherein the semiconductor structure comprises an RF switch.

13. The semiconductor structure of claim 1, wherein the polysilicon base region joins the plurality of polysilicon gate fingers at first ends of the polysilicon gate fingers, and wherein the triangular polysilicon extension regions include:

a first set of triangular polysilicon extension regions located at the first ends of the polysilicon gate fingers; and a second set of triangular polysilicon extension regions located at second ends of the polysilicon gate fingers, opposite the first ends of the polysilicon gate fingers.

14. The semiconductor structure of claim 1, further comprising a continuous metal silicide layer located on upper surfaces of the plurality of polysilicon gate fingers and upper surfaces of the plurality of triangular polysilicon extension regions.

15. A semiconductor structure comprising:

a plurality of parallel source/drain regions separated by a plurality of parallel transistor channel regions; and a polysilicon gate structure including:

a plurality of polysilicon gate fingers, each extending over a portion of a corresponding one of the parallel transistor channel regions;

a polysilicon base region adjoining the plurality of polysilicon gate fingers at first ends of each of the polysilicon gate fingers; and triangular extension regions adjoining the polysilicon base region and the plurality of polysilicon gate fingers at the first ends of the polysilicon gate fingers, wherein each of the triangular polysilicon extension regions extends over a portion of one of the plurality of channel regions, wherein the plurality of channel regions have first lengths under the polysilicon gate fingers, and wherein the plurality of channel regions have second lengths where the triangular polysilicon extension regions adjoin the polysilicon gate fingers, wherein the second lengths are greater than the first lengths.

16. The semiconductor structure of claim 15, wherein each of the plurality of polysilicon gate fingers is rectangular.

17. The semiconductor structure of claim 16, wherein the polysilicon base region is rectangular.

18. The semiconductor structure of claim 17, wherein the polysilicon base region is located perpendicular to each of the plurality of polysilicon gate fingers.

19. The semiconductor structure of claim 15, wherein the triangular polysilicon extension regions are located on opposing sides of each of the plurality of polysilicon gate fingers.

20. The semiconductor structure of claim 15, further comprising a continuous metal silicide layer located on upper surfaces of the plurality of polysilicon gate fingers and upper surfaces of the plurality of triangular polysilicon extension regions.

21. A semiconductor structure comprising:

a plurality of parallel source/drain regions separated by a plurality of parallel transistor channel regions; and a polysilicon gate structure including:

a plurality of polysilicon gate fingers, each extending over a corresponding one of the parallel transistor channel regions;

a polysilicon base region adjoining the plurality of polysilicon gate fingers at first ends of each of the polysilicon gate fingers;

triangular extension regions adjoining the polysilicon base region and the plurality of polysilicon gate fingers at the first ends of the polysilicon gate fingers; and additional triangular extension regions located at second ends of the polysilicon gate fingers, opposite the first ends of the polysilicon gate fingers.

* * * * *